United States Patent
Yang et al.

(10) Patent No.: US 8,519,802 B2
(45) Date of Patent: Aug. 27, 2013

(54) PULSE WIDTH MODULATION DRIVING IC AND PULSE WIDTH MODULATION OUTPUT SIGNAL GENERATING METHOD

(75) Inventors: Chia-Tai Yang, Tainan (TW); Yi-Cheng Liu, New Taipei (TW); Ching-Sheng Li, Hsinchu County (TW); Kun-Min Chen, Changhua County (TW); Ching-Shan Lu, Kaohsiung (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 170 days.

(21) Appl. No.: 13/172,816

(22) Filed: Jun. 29, 2011

(65) Prior Publication Data

US 2012/0274411 A1   Nov. 1, 2012

(30) Foreign Application Priority Data

Apr. 26, 2011   (TW) .............................. 100114399 A

(51) Int. Cl.
*H03K 7/08* (2006.01)

(52) U.S. Cl.
USPC ............. 332/109; 320/145; 327/36; 370/212; 375/238

(58) Field of Classification Search
USPC .......... 320/145; 327/36; 332/109; 370/212; 375/238
See application file for complete search history.

(56) References Cited

U.S. PATENT DOCUMENTS

| 6,404,251 | B1* | 6/2002 | Dwelley et al. | 327/172 |
|---|---|---|---|---|
| 6,791,375 | B2* | 9/2004 | Yang et al. | 327/99 |
| 7,876,075 | B1* | 1/2011 | Chiu et al. | 323/229 |
| 8,330,439 | B2* | 12/2012 | Wu | 323/272 |
| 8,339,075 | B2* | 12/2012 | Hoogzaad | 318/376 |
| 2010/0026262 | A1* | 2/2010 | Sase et al. | 323/283 |
| 2010/0127789 | A1* | 5/2010 | Kenly et al. | 332/109 |
| 2011/0181262 | A1* | 7/2011 | Deguchi | 323/284 |

* cited by examiner

*Primary Examiner* — Arnold Kinkead
*Assistant Examiner* — Richard Tan
(74) *Attorney, Agent, or Firm* — Winston Hsu; Scott Margo

(57) ABSTRACT

The present invention discloses a pulse width modulation driving IC. The pulse width modulation driving IC includes a first pin, for receiving a first signal, a second pin, for receiving a second signal, a comparing unit, for comparing the first signal with a reference voltage, to generate a comparison result indicating a operating mode of the pulse width modulation driving IC, and an output unit, for outputting a pulse width modulation output signal according to the first signal, the second signal and the comparison result.

2 Claims, 7 Drawing Sheets

PULSE WIDTH MODULATION DRIVING IC AND PULSE WIDTH MODULATION OUTPUT SIGNAL GENERATING METHOD

BACKGROUND OF THE INVENTION

1. Field of the Invention

The present invention relates to a pulse width modulation (PWM) driving IC and a PWM output signal generating method, and more particularly, to a PWM driving IC and the PWM output signal generating method with less input pins to achieve both a direct PWM control mode and an indirect PWM control mode.

2. Description of the Prior Art

As the development of computer technology in recent years, the processing pulses of a central processing unit (CPU) increase rapidly, the heat generated from the CPU becomes more and more. Therefore, the need for heat-dissipation becomes more important as well. The main method for heat-dissipation among many those used in nowadays is still heat-dissipating fans. There are voltage control and pulse width modulation (PWM) control methods for heat-dissipating fans used in CPUs, wherein the control modes of the PWM control can be divided into a direct PWM control mode and an indirect PWM control mode.

In detail, please refer to FIG. 1A, which is a schematic diagram of a conventional PWM driving IC 10 having a direct PWM control mode. As shown in FIG. 1A, the PWM driving IC 10 comprises a PWM pin 102, for receiving a PWM signal PWMS such that the PWM driving IC 10 can directly output the PWM signal PWMS as a PWM output signal PWMout to control output and drive a fan.

For example, please refer to FIG. 1B, which is a schematic diagram of a driving circuit 104 of the PWM driving IC 10 shown in FIG. 1A. As shown in FIG. 1B, the PWM driving IC 10 can control on/off of an upper gate switch 106 and a lower gate switch 108 of the driving circuit 104 via the PWM output signal PWMout, to change a driving current IL of the fan, so as to change the rotational speed of the fan. In such a condition, please refer to FIG. 1C, which is a schematic diagram of the PWM signal PWMS and the PWM output signal PWMout of the PWM driving IC 10 shown in FIG. 1A. As shown in FIG. 1C, since the PWM output signal PWMout equals to the PWM signal PWMS, a duty of the PWM output signal PWMout and the corresponding rotational speed of the fan can be controlled via adjusting the duty of the inputted PWM signal PWMS.

However, since a rotational speed generated from the direct PWM control mode is proportional to the duty of the PWM signal PWMS, if there is a need for special applications, e.g. the PWM output signal with minimum or maximum operating duty, such as the operating duty of 20% or 80%, it needs to utilize the indirect PWM signal control mode.

Please refer to FIG. 2A, which is a schematic diagram of a conventional PWM driving IC 20 with an indirect PWM control mode. As shown in FIG. 2A, the PWM driving IC 20 comprises a set pin 202, an oscillating pin 204 and a comparator 206. The set pin 202 and the oscillating pin 204 receives a set signal SET and a triangle wave OSC, respectively. The comparator 206 compares the set signal SET with the triangle wave OSC to generate a PWM output signal PWMout', wherein the set signal SET relates to the duty of the inputted PWM signal PWMS. In such a condition, the PWM driving IC 20 can control output to drive the fan via the PWM output signal PWMout' according to the PWM signal PWMS indirectly, wherein the driving method is similar to that shown in FIG. 1B.

For example, by switching on/off of a bipolar junction transistor (BJT) Q1 via the input PWM signal PWMS plus, the DC set signal SET inversely proportional to the duty of the inputted PWM signal PWMS can be generated by a voltage circuit 208 and a filter circuit 210, i.e. during on-time of the PWM signal PWMS, the BJT Q1 is turned on and the resistances R2 and R3 are connected in parallel, so a voltage cross the resistance R3 is less.

In such a condition, please refer to FIG. 2B, which is a schematic diagram of the set signal SET, the triangle wave OSC and the PWM output signal PWMout' shown in FIG. 2A. As shown in FIG. 2B, the comparator 206 can compare the DC set signal SET with the triangle wave OSC generated from an oscillator 212 to generate the PWM output signal PWMout'. As a result, the relation between the set signal SET and the duty of the inputted PWM signal PWMS is decided via adjusting the resistances R1-R3 of a voltage divider circuit 208, so as to decide the minimum or maximum operating duty of the PWM output signal PWMout' and the corresponding minimum or maximum rotational speed.

For example, when the duty of the PWM signal PWMS is 0%, the voltage of the set signal SET equals to a voltage cross the resistances R2 and R3. At this moment, if resistances of the resistances R2 and R3 are greater, the maximum of the set signal SET is greater, such that the minimum operating duty and the corresponding minimum rotational speed of the PWM output signal PWMout' are less, so as to adjust the minimum operating duty of the PWM output signal PWMout' and the corresponding minimum rotational speed. Therefore, the maximum operating duty of the PWM output signal PWMout' and the corresponding maximum rotational speed can be adjusted by the same token.

Noticeably, in order to make both the duty and a frequency of the PWM output signal PWMout' adjustable, the circuit for generating the set signal SET and a capacitor cascaded to the oscillator 212 shown in FIG. 2A are both outside the PWM driving IC 20, so the PWM driving IC 20 need to include the set pin 202 and the oscillating pin 204.

On the other hand, please refer to FIG. 3, which is a schematic diagram of a conventional PWM driving IC 30 with both a direct PWM control mode and an indirect PWM control mode. As shown in FIG. 3, if the prior art tends to have both the direct PWM control mode and the indirect PWM control mode, the PWM driving IC 30 must comprise 3 input pins 302-306 for receiving the PWM signal PWMS, the set signal SET and the triangle wave OSC to perform the operations of the PWM driving IC 10 and 20, respectively.

However, due to limited pins of a general PWM driving IC, if the conventional PWM driving IC realizes both the direct PWM control mode and the indirect PWM control mode with 3 pins, the functions of the PWM driving IC are limited. Therefore, there is a need to improve the prior art.

SUMMARY OF THE INVENTION

It is therefore an objective to provide a PWM driving IC and the PWM output signal generating method with less input pins to achieve a direct PWM control mode and an indirect PWM control mode at the same time.

The present invention discloses a PWM driving IC, which include a first pin, for receiving a first signal; a second pin, for receiving a second signal; a comparing unit, for comparing the first signal with a reference voltage to generate a comparison result indicating an operating mode of the PWM driving IC; and an output unit, for outputting a PWM output signal according to the first signal, the second signal and the comparison result.

The present invention further discloses a PWM output signal generating method for a PWM driving IC, the PWM output signal generating method includes steps of receiving a first signal and a second signal; comparing the first signal with a reference voltage to generate a comparison result indicating an operating mode of the PWM driving IC; and outputting a PWM output signal according to the first signal, the second signal and the comparison result.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
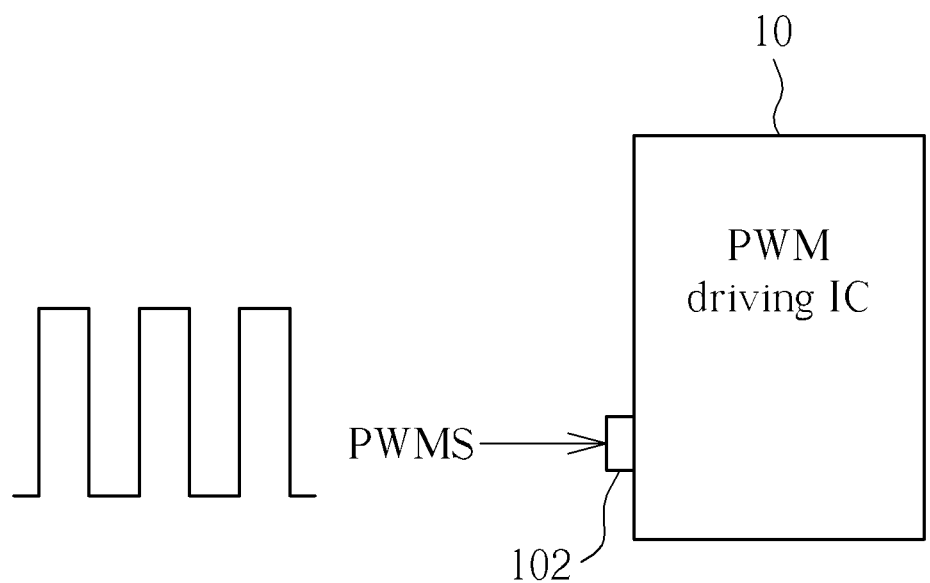
FIG. 1A is a schematic diagram of a conventional PWM driving IC 10 having a direct PWM control mode.
Figure 1B:
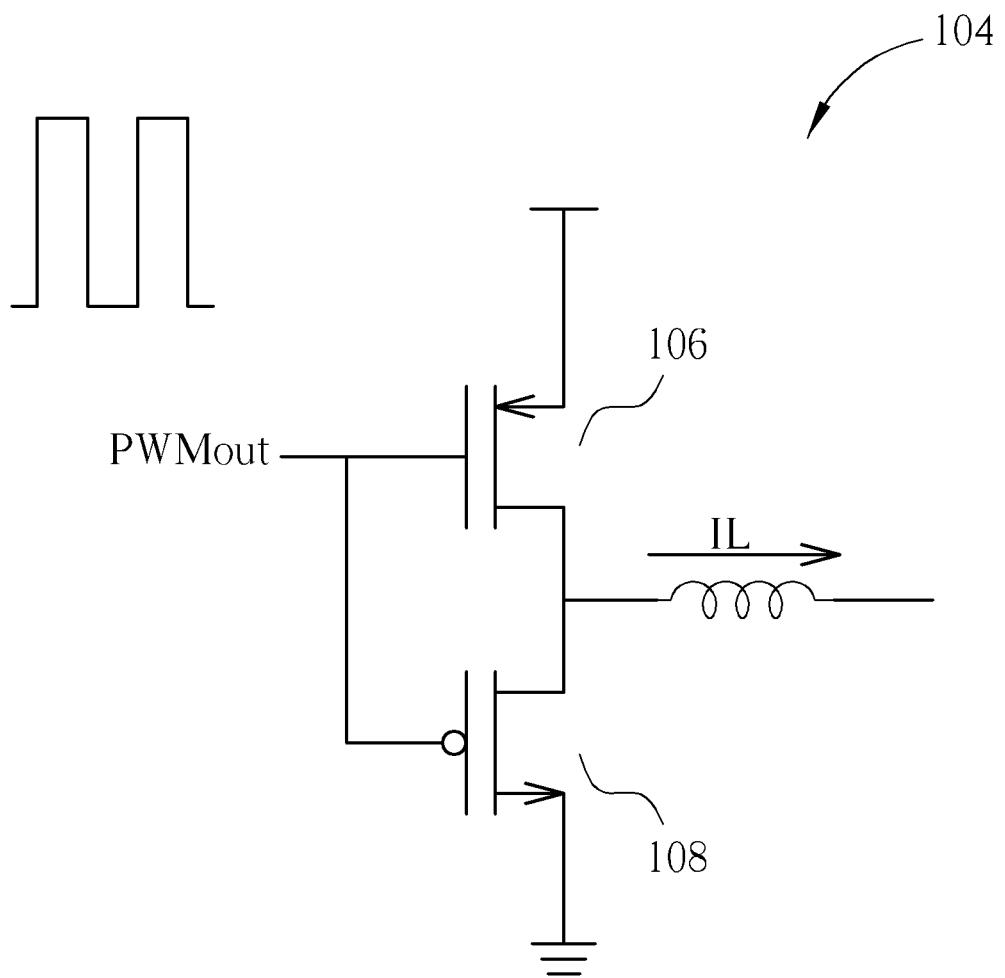
FIG. 1B is a schematic diagram of a driving circuit of a PWM driving IC shown in FIG. 1A.
Figure 1C:
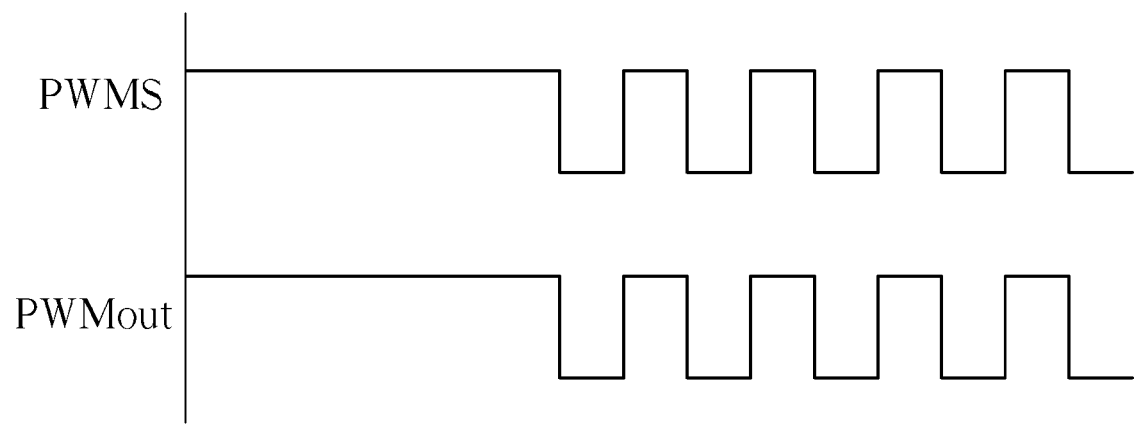
FIG. 1C is a schematic diagram of a PWM signal and PWM output signal of a PWM driving IC shown in FIG. 1A.
Figure 4:
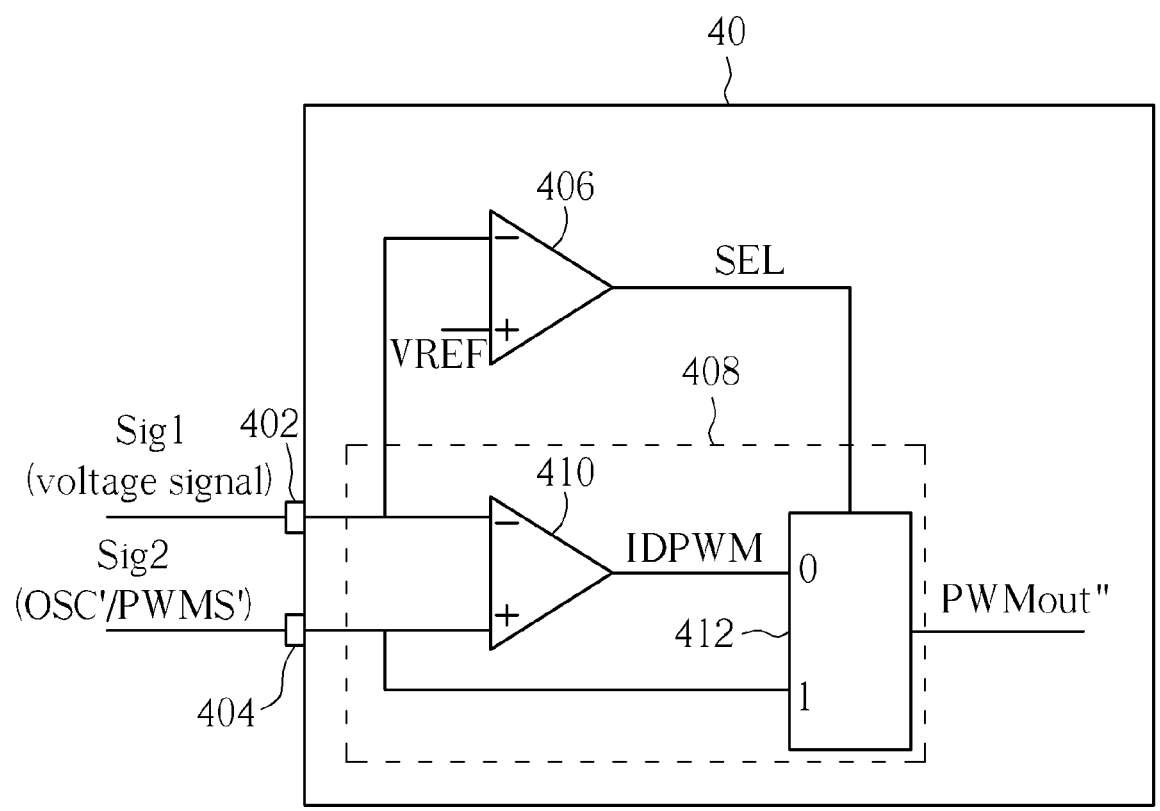
FIG. 4 is a schematic diagram of a PWM driving IC 40 having a direct PWM control mode and an indirect PWM control mode according to an embodiment of the present invention.

Please refer to FIG. 4, which is a schematic diagram of a pulse width modulation (PWM) driving IC 40 having a direct PWM control mode DPWMM and an indirect PWM control mode IDPWMM according to an embodiment of the present invention. As shown in FIG. 4, the PWM driving IC 40 comprises pins 402 and 404, a comparing unit 406 and an output unit 408, and the PWM driving IC 40 can further comprise a driving circuit 104 for driving the fan as shown in FIG. 1B.

In short, the pins 402 and 404 can receive signals SIG1 and SIG2, respectively. The signal SIG1 can be a voltage signal, while the signal SIG2 can be a triangle wave OSC' or a PWM signal PWMS'. Then, the comparing unit 406 can compare the signal SIG1 with a reference voltage VREF, to determine if the signal SIG1 is a set signal SET'. Thus, the comparing unit 406 can generate a comparison result SEL to indicate an operating mode OP of the PWM driving IC 40 is the direct PWM control mode DPWMM or the indirect PWM control mode IDPWMM. At last, the output unit 408 can output a PWM output signal PWMout" for controlling the output to drive the fan according to the signals SIG1, SIG2 and the comparison result SEL, wherein the realization of driving manner is similar to that shown in FIG. 1B.

In such a condition, the PWM driving IC 40 can detect a voltage level of the signal SIG1 to decide whether the signal SIG2 is the triangle wave OSC' or the PWM signal PWMS', and then, the PWM driving IC 40 outputs the PWM output signal PWMout" accordingly. Therefore the input pins of the triangle wave OSC' and the PWM signal PWMS' can be combined into the pin 404. As a result, in contrast to the conventional PWM driving IC with 3 input pins, the PWM driving IC 40 with the two pins 402 and 404 can have both the direct PWM control mode DPWMM and the indirect PWM control mode IDPWMM, and thus the PWM driving IC 40 can realize more functions with limited pins.

In detail, the comparing unit 406 compares the signal SIG1 with the reference voltage VREF. When the signal SIG1 is less than the reference voltage VREF, the comparing unit 406 determines the signal SIG1 is not the set signal SET', and thus the comparison result SEL indicates the operating mode OP of the PWM driving IC 40 is the direct PWM control mode DPWMM. In such a situation, the signal SIG2 is the PWM signal PWMS', and thus the output unit 408 outputs the PWM output signal PWMout' as the direct PWM signal PWMS".

Figure 2A:
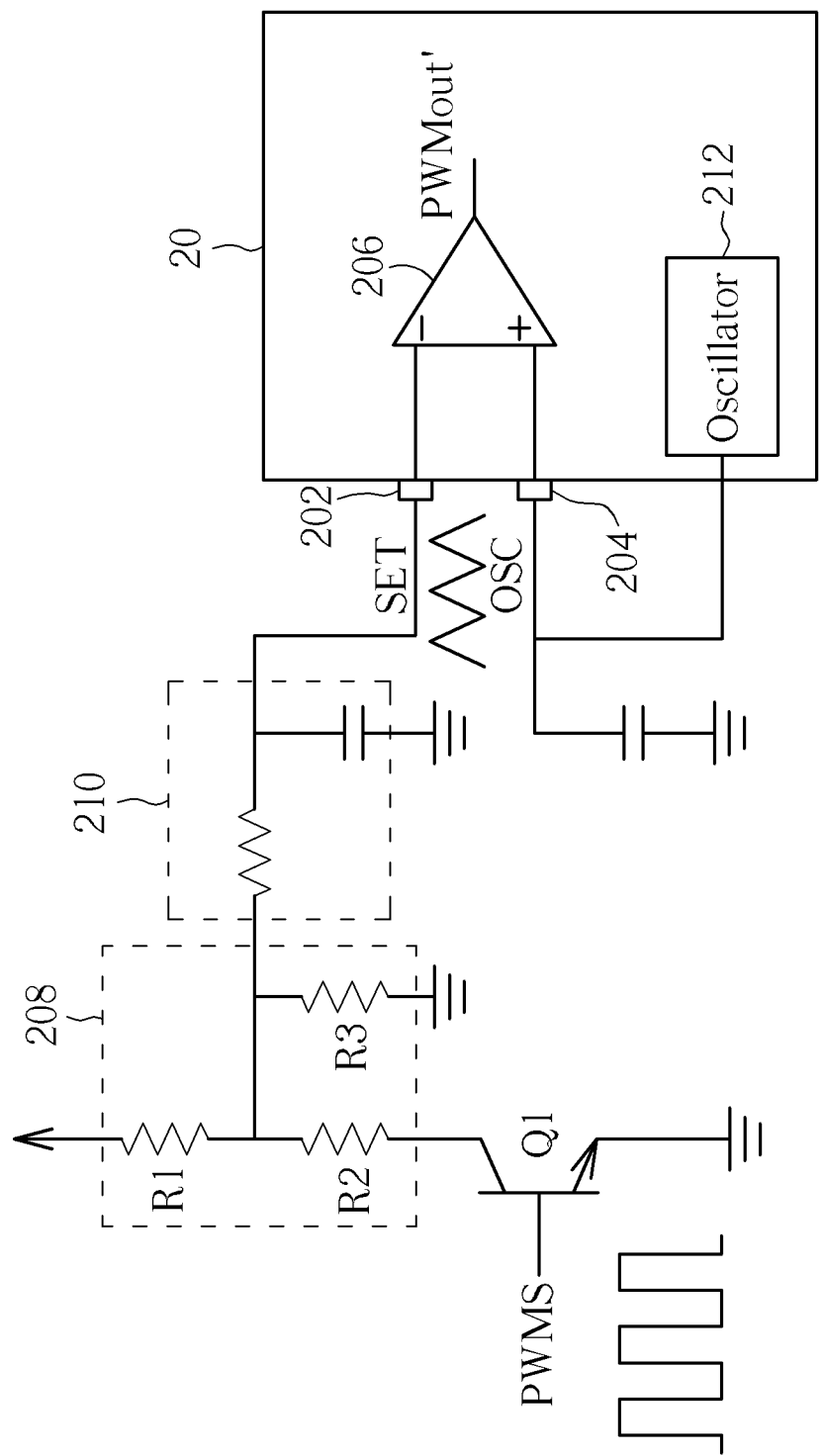
FIG. 2A is a schematic diagram of a conventional PWM driving IC with an indirect PWM control mode.
Figure 2B:
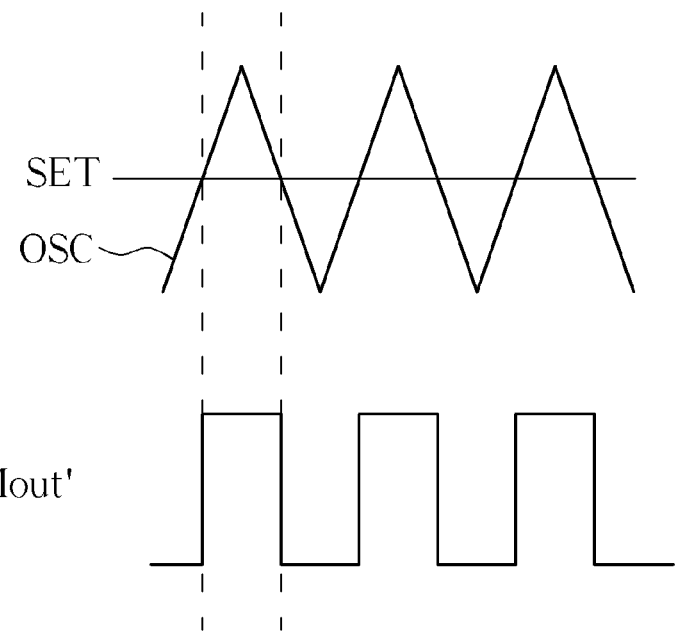
FIG. 2B is a schematic diagram of the set signal, the triangle wave and the PWM output signal shown in FIG. 2A.
Figure 3:
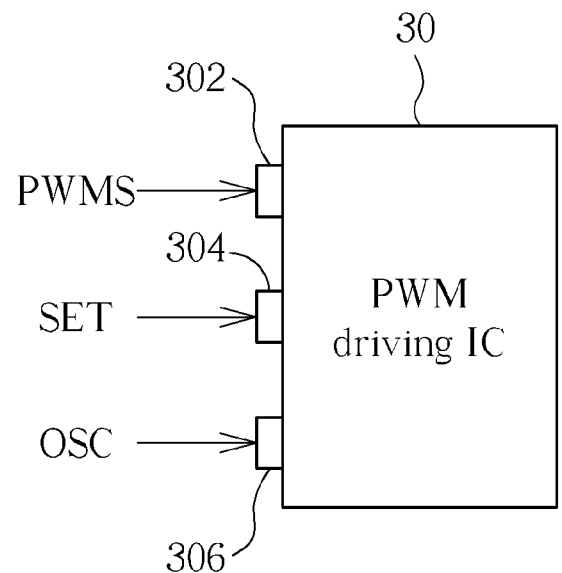
FIG. 3 is a schematic diagram of a conventional PWM driving IC with a direct PWM control mode and an indirect PWM control mode.

On the other hand, when the signal SIG1 is greater than the reference voltage VREF, the comparing unit 406 determines the signal SIG1 is the set signal SET', and thus the comparison result SEL indicates the operating mode OP of the PWM driving IC 40 is the indirect PWM control mode IDPWMM. In such a situation, the signal SIG2 is the triangle wave OSC', and the output unit 408 compares the set signal SET' with the triangle wave OSC' to generate an indirect PWM signal IDPWM as the PWM output signal PWMout". The generating manner of the indirect PWM signal IDPWM is similar to that shown in FIG. 2B.

Specifically, the output unit 408 comprises a comparator 410 and a multiplexer 412. A negative input terminal and a positive input terminal of the comparator 410 receives the signals SIG1 and SIG2, respectively. The comparator 410 can compare the signals SIG1 and SIG2 to output an indirect PWM signal IDPWM at an output terminal. An input terminal of the multiplexer 412 receives the indirect PWM signal IDPWM and another input terminal of the multiplexer 412 receives the signal SIG2. The multiplexer 412 performs selection from the indirect PWM signal IDPWM and the signal SIG2 according to the comparison result SEL, so as to output the PWM output signal PWMout".

In such a condition, if the signal SIG1 is less than the reference voltage VREF, the multiplexer 412 selects the signal SIG2 as the PWM output signal PWMout", which means the operating mode OP of the PWM driving IC 40 is the direct PWM control mode DPWMM and the signal SIG2 is the PWM signal PWMS'. On the other hand, if the signal SIG1 is greater than the reference voltage VREF, the multiplexer 412 selects the indirect PWM signal IDPWM as the PWM output signal PWMout", which means the operating mode OP of the PWM driving IC 40 is the indirect PWM control mode IDPWMM and the signal SIG2 is the triangle wave OSC'. As a result, the output unit 408 can output the proper PWM output signal PWMout" for controlling output and driving the fan according to the signals SIG1, SIG2 and the comparison result SEL.

Noticeably, the main spirit of the present invention is the PWM driving IC 40 can detect the voltage level of the signal SIG1 of the pin 402 to decide whether the signal SIG2 of the pin 404 is the triangle wave OSC' or the PWM signal PWMS', and the PWM driving IC 40 outputs the PWM output signal PWMout" based on above decision. Therefore the input pins of the triangle wave OSC' and the PWM signal PWMS' can be combined into the input pin 404. Those skilled in the art should make modifications or alterations accordingly. For example, the reference voltage VREF preferably has a voltage level which lies between a trough of the triangle wave OSC' and the voltage level when the signal SIG1 is the signal inset signal SET', so that the comparing unit 406 avoid misjudging the operating mode OP of the PWM driving IC 40. Besides, a circuit for generating the set signal SET' and the triangle wave OSC' can be similar to that shown in FIG. 2A, and is not limit to this. Moreover, realized methods of the specific circuit for the comparing unit 406 and the output unit 408 are not limited to the circuits shown in FIG. 4, as long as each circuit can achieve its own functions.

Figure 5:
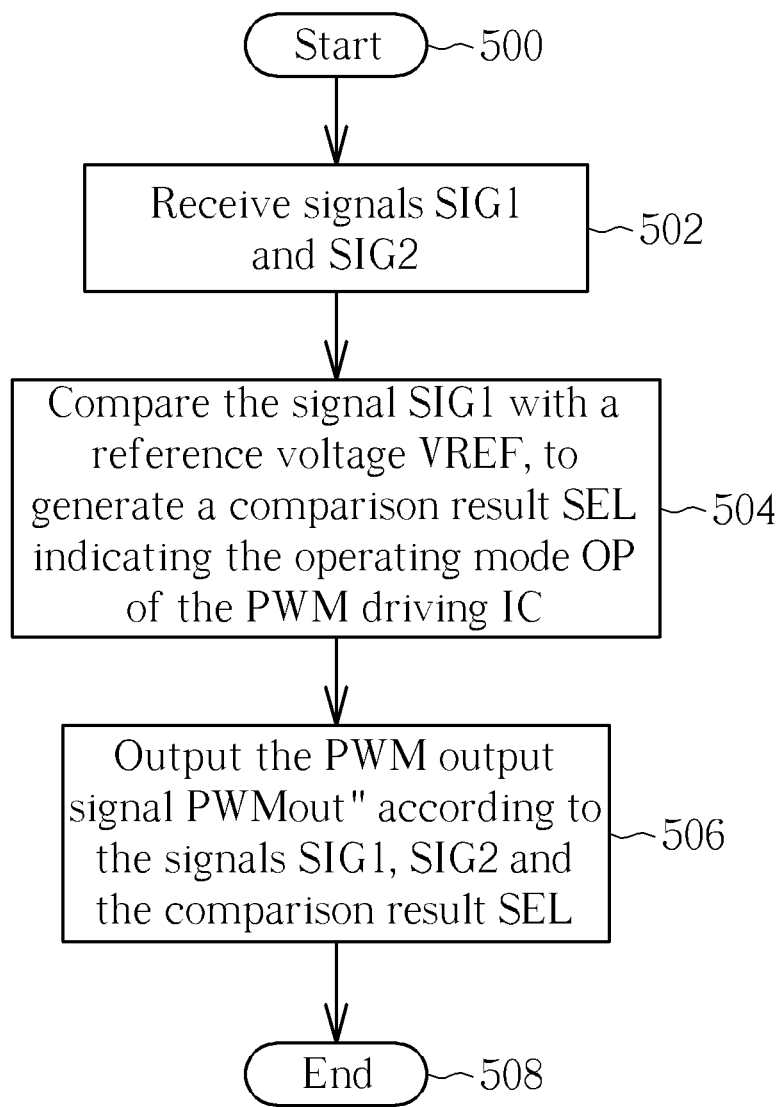
FIG. 5 is a PWM output signal generating process according to an embodiment of the present invention.

Therefore, outputting operations of the PWM driving IC 40 related to the PWM output signal PWMout" can be summarized into a PWM output signal generating process 50, as shown in FIG. 5. The PWM output signal generating process 50 includes following steps:

Step 500: Start.

Step 502: Receive signals SIG1 and SIG2.

Step 504: Compare the signal SIG1 with a reference voltage VREF, to generate a comparison result SEL indicating the operating mode OP of the PWM driving IC 40.

Step 506: Output the PWM output signal PWMout" according to the signals SIG1, SIG2 and the comparison result SEL.

Step 508: End.

Details of the PWM output signal generating process 50 can be derived by referring to the description of the PWM driving IC 40.

In the prior art, the method of utilizing 3 pins to realize both the direct PWM control mode and indirect PWM control mode results limited functions of the conventional PWM driving IC due to limited pins. In comparison, the PWM driving IC 40 of the present invention can detect the voltage level of the signal SIG1 of the pin 402 and decide whether the signal SIG2 of the pin 404 is the triangle wave OSC' or the PWM signal PWMS', and thus the PWM driving IC 40 can output the PWM output signal PWMout" accordingly. Therefore, the input pins of the triangle wave OSC' and the PWM signal PWMS' can be combined into the pin 404, and the PWM driving IC 40 can have both the direct PWM control mode and the indirect PWM control mode with fewer pins, therefore the PWM driving IC 40 can realize more functions with limited pins.

To sum up, the PWM driving IC of the present invention can achieve both the direct PWM control mode and the indirect PWM control mode with fewer pins.

Those skilled in the art will readily observe that numerous modifications and alterations of the device and method may be made while retaining the teachings of the invention.

What is claimed is:

1. A pulse width modulation (PWM) driving IC, comprising:
   a first pin, for receiving a first signal;
   a second pin, for receiving a second signal;
   a comparing unit, for comparing the first signal with a reference voltage to generate a comparison result indicating an operating mode of the PWM driving IC; and
   an output unit, for outputting a PWM output signal according to the first signal, the second signal and the comparison result;
   wherein the comparison result indicates the operating mode of the PWM driving IC is an indirect PWM control mode if the first signal is greater than the reference voltage;
   wherein the first signal and the second signal are a set signal and a triangle wave, respectively, and the output unit compares the set signal with the triangle wave to generate and output an indirect PWM signal as the PWM output signal.

2. A pulse width modulation (PWM) output signal generating method for a PWM driving IC, comprising:
   receiving a first signal and a second signal;
   comparing the first signal with a reference voltage to generate a comparison result indicating an operating mode of the PWM driving IC; and
   outputting a PWM output signal according to the first signal, the second signal and the comparison result;
   wherein the comparison result indicates the operating mode of the PWM driving IC is an indirect PWM control mode if the first signal is greater than the reference voltage;
   wherein the first signal and the second signal are a set signal and a triangle wave, respectively, and the step of outputting the PWM output signal according to the first signal, the second signal and the comparison result comprises:
      comparing the set signal with the triangle wave to generate and output an indirect PWM signal as the PWM output signal.

* * * * *